US009671735B2

(12) United States Patent
Aikawa

(10) Patent No.: US 9,671,735 B2
(45) Date of Patent: Jun. 6, 2017

(54) DIFFERENTIAL TRANSFORMER MAGNETIC PERMEABILITY SENSOR

(71) Applicant: KYOCERA Document Solutions Inc., Osaka (JP)

(72) Inventor: Yukihiro Aikawa, Osaka (JP)

(73) Assignee: KYOCERA Document Solutions Inc., Osaka (JP)

( * ) Notice: Subject to any disclaimer, the term of this patent is extended or adjusted under 35 U.S.C. 154(b) by 0 days.

(21) Appl. No.: 14/974,560

(22) Filed: Dec. 18, 2015

(65) Prior Publication Data

US 2016/0187163 A1 Jun. 30, 2016

(30) Foreign Application Priority Data

Dec. 26, 2014 (JP) ................................ 2014-264056

(51) Int. Cl.

| | |
|---|---|
| ***G03G 15/08*** | (2006.01) |
| ***G01R 33/028*** | (2006.01) |
| ***G01R 33/04*** | (2006.01) |
| ***G03G 15/00*** | (2006.01) |

(52) U.S. Cl.

CPC ......... *G03G 15/556* (2013.01); *G03G 15/086* (2013.01); *G03G 15/0853* (2013.01); *G03G 2215/0888* (2013.01)

(58) Field of Classification Search

CPC .... G03G 15/08; G03G 15/028; G01R 33/028; G01R 33/04

USPC ............ 324/207.16, 207.17, 207.18, 207.19, 324/207.22, 228, 258

See application file for complete search history.

(56) References Cited

U.S. PATENT DOCUMENTS

2013/0099778 A1* 4/2013 Aikawa ................. G01R 33/04 324/207.17

FOREIGN PATENT DOCUMENTS

| | | | | |
|---|---|---|---|---|
| JP | 2001099654 | * 4/2001 | | G01C 17/30 |
| JP | 2001-165910 A | 6/2001 | | |
| JP | 2013-101103 A | 5/2013 | | |

* cited by examiner

*Primary Examiner* — Son Le
*Assistant Examiner* — Neel Shah
(74) *Attorney, Agent, or Firm* — Stein IP, LLC

(57) ABSTRACT

Provided is a differential transformer magnetic permeability sensor that accurately suppress a variation of output level of each sensor even if a position shift occurs in forming a detection coil, a reference coil, and a drive coil as planar coils. The differential transformer magnetic permeability sensor includes a first coil layer including a first drive coil constituted of a first wire of a flat winding and a detection coil constituted of a second wire of a flat winding, a second coil layer including a second drive coil constituted of a third wire of a flat winding and a reference coil constituted of a fourth wire of a flat winding. The first drive coil and the second drive coil are connected so that drive current have the same direction, while the detection coil and the reference coil are connected so that induced current have opposite directions.

2 Claims, 14 Drawing Sheets

DIFFERENTIAL TRANSFORMER MAGNETIC PERMEABILITY SENSOR

INCORPORATION BY REFERENCE

This application is based upon and claims the benefit of priority from the corresponding Japanese Patent Application No. 2014-264056 filed Dec. 26, 2014, the entire contents of which are hereby incorporated by reference.

BACKGROUND

The present disclosure relates to a differential transformer magnetic permeability sensor.

In an image forming apparatus using toner as a developer, a magnetic permeability sensor is used for detecting remaining toner amount or density. There are various types of the magnetic permeability sensor, and one of them is a differential transformer magnetic permeability sensor, which has a structure in which a drive coil, a detection coil, and a reference coil are arranged on the same core.

Using planar coils, the differential transformer magnetic permeability sensor can be downsized. For instance, as an example of the differential transformer magnetic permeability sensor using planar coils, there is conventionally proposed a structure including a first coil (drive coil) disposed in a first layer, a second coil (reference coil) disposed in a second layer, a third coil (detection coil) disposed in a third layer, a fourth coil (drive coil) disposed in a fourth layer, and insulating substrates disposed between layers.

However, the differential transformer magnetic permeability sensor using planar coils as described above may cause a position shift in forming the drive coil, the detection coil, and the reference coil due to an error in the manufacturing process or the like. As a result, in a state where there is no magnetic substance to be detected, an amount of magnetic flux passing through the detection coil and an amount of magnetic flux passing through the reference coil cannot be equalized, and therefore accuracy of measurement is deteriorated. In particular, when a shift amount is different in each sensor, in a state where there is no magnetic substance to be detected, a difference between the amount of magnetic flux passing through the detection coil and the amount of magnetic flux passing through the reference coil is different in each sensor. As a result, a variation of output level occurs in each sensor, and hence accuracy of measurement is deteriorated.

Accordingly, for example, there is already proposed a differential transformer magnetic (magnetic permeability) sensor in which a first differential coil (reference coil) constituted of a flat winding wire and a first drive coil constituted of a flat winding wire parallel to the wire constituting the first differential coil are arranged on a first surface of an insulating single layer substrate, while a second differential coil (detection coil) constituted of a flat winding wire and a second drive coil constituted of a flat winding wire parallel to the wire constituting the second differential coil are arranged on a second surface of the substrate.

In this parallel flat winding differential transformer magnetic sensor, a plurality of first branch lines are further disposed so as to branch from the wire forming the outermost periphery of the first differential coil and are arranged so that an amount of magnetic flux passing through each of the first branch lines is different when the first drive coil is driven. In the same manner, a plurality of second branch lines are disposed so as to branch from the wire forming the outermost periphery of the second differential coil and are arranged so that an amount of magnetic flux passing through each of the first branch lines is different when the second drive coil is driven. Further, one of the plurality of first branch lines and one of the plurality of second branch lines are selectively used so as to take a balance between an electromotive force generated in the first differential coil and an electromotive force generated in the second differential coil (to perform zero adjustment).

However, in the parallel flat winding differential transformer magnetic permeability sensor described above, the wire constituting the reference coil and the wire constituting the first drive coil are arranged in parallel to each other. In the same manner, the wire constituting the detection coil and the wire constituting the second drive coil are arranged in parallel to each other. In other words, capacitance between the reference coil and the first drive coil as well as capacitance between the detection coil and the second drive coil is large, as if capacitors are connected respectively between the reference coil and the first drive coil and between the detection coil and the second drive coil, with electrodes that are the wires constituting the coils.

As a result, in the parallel flat winding differential transformer magnetic permeability sensor described above, a voltage variation of the drive coil can easily cause voltage variations of the reference coil and the detection coil via the capacitors between the wires. In this way, the voltages generated in the reference coil and the detection coil have phases different from those of the voltages generated in the reference coil and the detection coil when current flows in the drive coil, and hence the voltages cannot be reduced even if any branch line described above is selected.

SUMMARY

A differential transformer magnetic permeability sensor according to an aspect of the present disclosure includes a first coil layer including a first drive coil constituted of a first wire of a flat winding arranged on a plane and a detection coil constituted of a second wire of a flat winding arranged on the same plane as the first wire around the first drive coil to be concentric with the first drive coil, a second coil layer including a second drive coil constituted of a third wire of a flat winding arranged on a plane and a reference coil constituted of a fourth wire of a flat winding arranged on the same plane as the third wire around the second drive coil to be concentric with the second drive coil, and a first insulating layer disposed between the first coil layer and the second coil layer. In addition, the first drive coil and the second drive coil are electrically connected to each other so that drive current flowing in the first drive coil and drive current flowing in the second drive coil have the same direction, and the detection coil and the reference coil are electrically connected to each other so that induced current flowing in the detection coil and induced current flowing in the reference coil have opposite directions.

Alternatively, a differential transformer magnetic permeability sensor according to another aspect of the present disclosure includes a first coil layer including a detection coil constituted of a second wire of a flat winding arranged on a plane and a first drive coil constituted of a first wire of a flat winding arranged on the same plane as the second wire around the detection coil to be concentric with the detection coil, a second coil layer including a reference coil constituted of a fourth wire of a flat winding arranged on a plane and a second drive coil constituted of a third wire of a flat winding arranged on the same plane as the fourth wire around the reference coil to be concentric with the reference coil, and a first insulating layer disposed between the first coil layer and the second coil layer. In addition, the first drive coil and the second drive coil are electrically connected to each other so that drive current flowing in the first drive coil and drive current flowing in the second drive coil have the same direction, and the detection coil and the reference coil are electrically connected to each other so that induced current flowing in the detection coil and induced current flowing in the reference coil have opposite directions.

DETAILED DESCRIPTION

Figure 1:
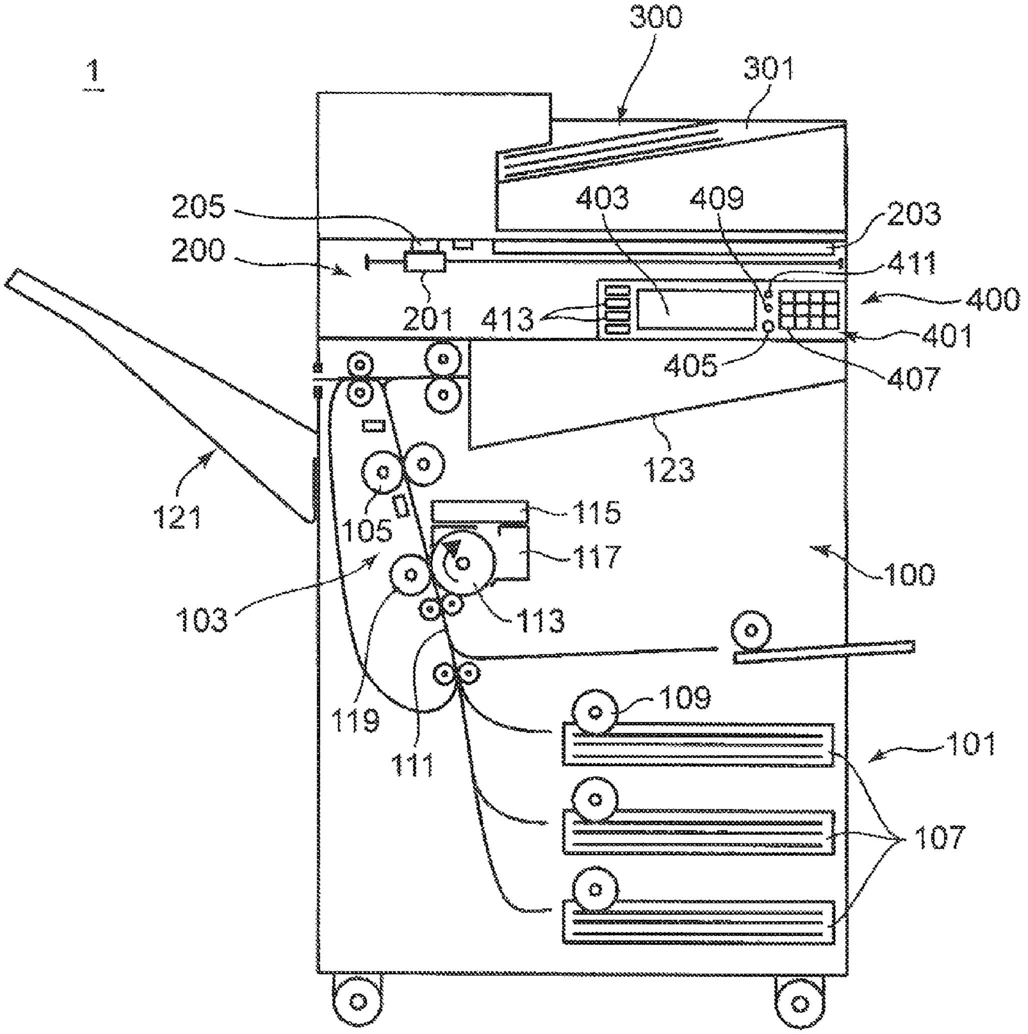
FIG. 1 is a diagram illustrating a schematic internal structure of an image forming apparatus, to which a differential transformer magnetic permeability sensor according to an embodiment of the present disclosure can be applied.

Now, embodiments of the present disclosure are described in detail with reference to the drawings. FIG. 1 is a diagram illustrating a schematic internal structure of an image forming apparatus, to which a differential transformer magnetic permeability sensor according to an embodiment of the present disclosure can be applied. The image forming apparatus 1 is, for example, a digital multifunction peripheral having functions as a copier, a printer, a scanner, and a facsimile machine. The image forming apparatus 1 includes an apparatus main body 100, a document reader 200 disposed above the apparatus main body 100, a document feeder 300 disposed on the document reader 200, and an operation unit 400 disposed at an upper front portion of the apparatus main body 100.

The document feeder 300 works as an automatic document feeding device and is capable of feeding a plurality of document sheets set on a document placing portion 301 so that the document reader 200 can read the document sheets successively.

The document reader 200 includes a carriage 201 equipped with an exposing lamp and the like, a document table 203 made of a transparent material such as glass, a charge coupled device (CCD) sensor (not illustrated), and a document reading slit 205. When a document placed on the document table 203 is read, the carriage 201 is moved in a longitudinal direction of the document table 203 while the CCD sensor reads the document. In contrast, when a document sheet fed from the document feeder 300 is read, the carriage 201 is moved to a position opposed to the document reading slit 205, and the CCD sensor reads the document sheet fed from the document feeder 300 through the document reading slit 205. The CCD sensor outputs image data of the read document.

The apparatus main body 100 includes a paper sheet storing unit 101, an image forming unit 103, and a fixing unit 105. The paper sheet storing unit 101 is disposed in the lowermost part of the apparatus main body 100 and is equipped with a paper sheet tray 107 capable of storing a stack of paper sheets. An uppermost paper sheet of the stack of paper sheets stored in the paper sheet tray 107 is sent out toward a paper sheet transport path 111 when a pickup roller 109 is driven. The paper sheet is conveyed to the image forming unit 103 through the paper sheet transport path 111.

The image forming unit 103 forms a toner image on the conveyed paper sheet. The image forming unit 103 includes a photosensitive drum 113, an exposing unit 115, a developing unit 117 and a transferring unit 119. The exposing unit 115 generate light modulated in accordance with image data (such as image data output from the document reader 200, image data transmitted from a personal computer, or image data received via facsimile), and irradiates with the light the circumferential surface of the photosensitive drum 113 charged uniformly. In this way, an electrostatic latent image corresponding to the image data is formed on the circumferential surface of the photosensitive drum 113. In this state, toner is supplied from the developing unit 117 to the circumferential surface of the photosensitive drum 113, and hence a toner image corresponding to the image data is formed on the circumferential surface. This toner image is transferred by the transferring unit 119 onto the paper sheet fed from the paper sheet storing unit 101 described above.

The paper sheet with the transferred toner image is conveyed to the fixing unit 105. The fixing unit 105 applies heat and pressure to the toner image and the paper sheet so that the toner image is fixed to the paper sheet. The paper sheet is discharged onto a stack tray 121 or a sheet discharge tray 123. In this way, the image forming apparatus 1 prints a monochrome image.

The operation unit 400 includes an operation key unit 401 and a display unit 403. The display unit 403 has a touch panel function, and displays a screen including software keys. A user operates the software keys while viewing the screen, so as to perform setting necessary for executing a function such as copying.

The operation key unit 401 includes operation keys as hardware keys. Specifically, the operation key unit 401 includes a start key 405, a ten-key 407, a stop key 409, a reset key 411, a function switching key 413 for switching among copying, printing, scanning, and facsimile, and other keys.

The start key 405 is a key to start an operation such as copying, facsimile transmission, or the like. The ten-key 407 is a key to input numbers such as the number of copies and a facsimile number. The stop key 409 is a key to stop a copy operation or the like. The reset key 411 is a key to reset set contents to an initial set state.

The function switching key 413 includes a copy key, a transmission key, and the like so as to switch among a copy function, a transmission function, and the like. When the copy key is operated, an initial screen for copying is displayed on the display unit 403. When the transmission key is operated, an initial screen for facsimile transmission and mail transmission is displayed on the display unit 403.

Figure 2:
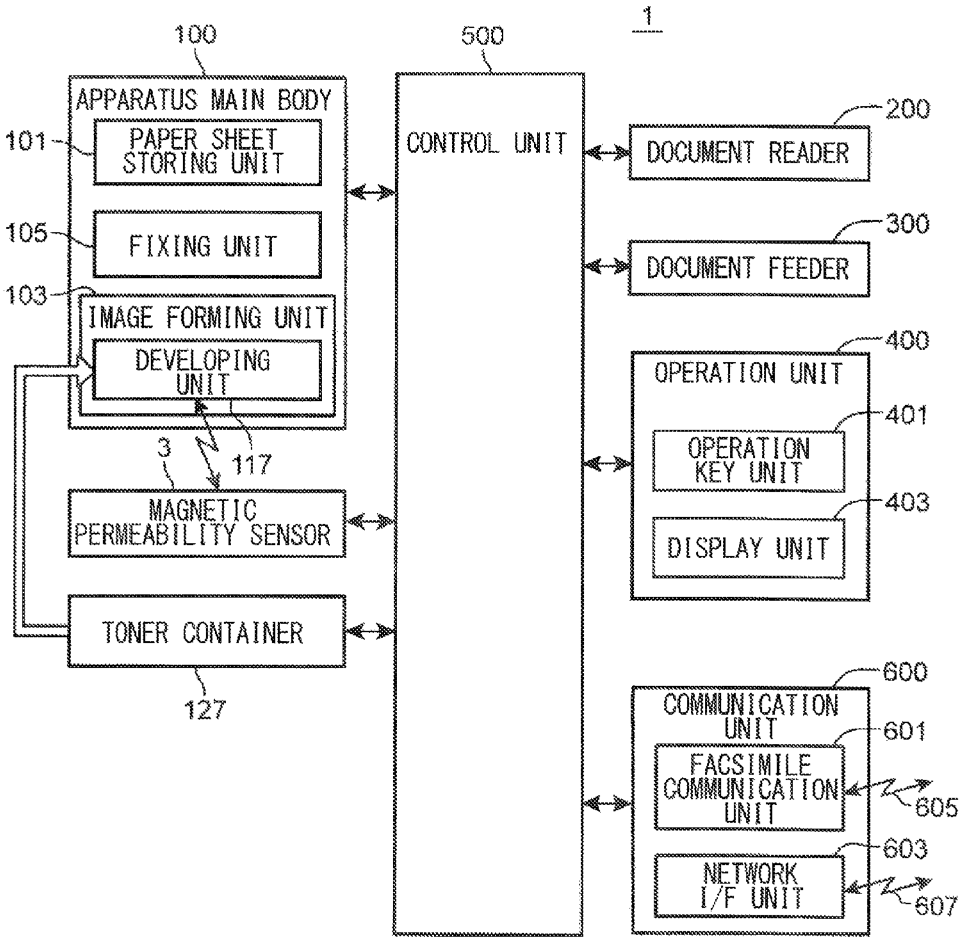
FIG. 2 is a block diagram illustrating a structure of the image forming apparatus.

FIG. 2 is a block diagram illustrating a structure of the image forming apparatus 1. The image forming apparatus 1 has a structure in which the apparatus main body 100, a differential transformer magnetic permeability sensor 3 (hereinafter referred to as a magnetic permeability sensor 3), a toner container 127, the document reader 200, the document feeder 300, the operation unit 400, a control unit 500, and a communication unit 600 are connected to each other via a bus. The apparatus main body 100, the document reader 200, the document feeder 300, and the operation unit 400 are already described above, and hence additional description is omitted.

The toner container 127 stores toner (magnetic one-component developer), and toner is supplied from the toner container 127 to the developing unit 117.

The magnetic permeability sensor 3 detects a variation of height of toner in the developing unit 117 and measures a remaining amount of toner in the developing unit 117 on the basis of the detected variation of height. The magnetic permeability sensor 3 will be described later in detail.

The control unit 500 includes a central processing unit (CPU), a read only memory (ROM), a random access memory (RAM), an image memory, and the like. The CPU performs control necessary for operating the image forming apparatus 1 on the above-mentioned units of the apparatus main body 100 of the image forming apparatus 1. The ROM stores software necessary for controlling operation of the image forming apparatus 1. The RAM is used for temporarily storing data generated when software is executed and storing application software. The image memory temporarily stores image data (such as image data output from the document reader 200, image data transmitted from the personal computer, and image data received via facsimile).

The communication unit 600 includes a facsimile communication unit 601 and a network I/F unit 603. The facsimile communication unit 601 includes a network control unit (NCU) for controlling connection of telephone line with a facsimile machine on the other end and a modulation and demodulation circuit for modulating and demodulating signal for facsimile communication. The facsimile communication unit 601 is connected to a telephone line 605.

The network I/F unit 603 is connected to a local area network (LAN) 607. The network I/F unit 603 is a communication interface circuit for communicating with a terminal device such as a personal computer connected to the LAN 607.

Figure 3:
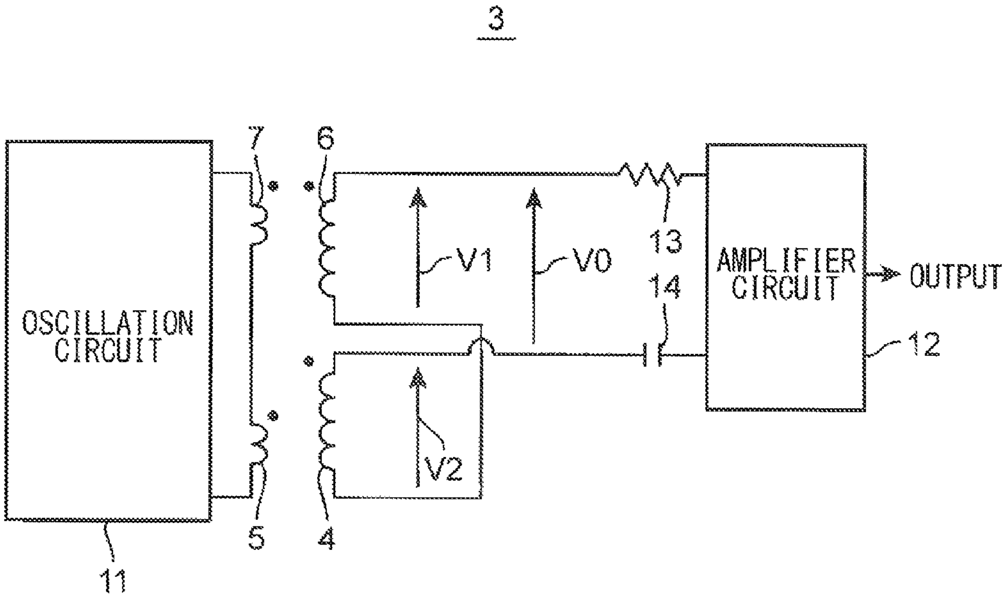
FIG. 3 is a diagram illustrating an example of a circuit diagram of the differential transformer magnetic permeability sensor.

FIG. 3 is a diagram illustrating an example of a circuit diagram of the magnetic permeability sensor 3. The magnetic permeability sensor 3 includes a detection coil 4, a first drive coil 5, a reference coil 6, a second drive coil 7, an oscillation circuit 11, an amplifier circuit 12, a resistor 13 and a capacitor 14. In addition, dots in FIG. 3 indicate polarities of windings.

The oscillation circuit 11 generates high frequency drive current for driving the first drive coil 5 and the second drive coil 7. The first drive coil 5 and the second drive coil 7 are connected in series. One end of the first drive coil 5 and one end of the second drive coil 7 are connected so that when the drive current flows in the first drive coil 5 and the second drive coil 7, the magnetic flux generated by the first drive coil 5 and the magnetic flux generated by the second drive coil 7 have the same direction (in other words, the drive current flowing in the first drive coil 5 and the drive current flowing in the second drive coil 7 have the same direction). In this way, the magnetic flux generated in the first drive coil 5 and the magnetic flux generated in the second drive coil 7 are not canceled by each other. The other end of the first drive coil 5 and the other end of the second drive coil 7 are connected to the oscillation circuit 11.

The detection coil 4 is magnetically coupled to the first drive coil 5. The reference coil 6 is magnetically coupled to the second drive coil 7. One end of the detection coil 4 and one end of the reference coil 6 are differentially connected in series. In other words, the detection coil 4 and the reference coil 6 are electrically connected so that induced current flowing in the detection coil 4 and induced current flowing in the reference coil 6 have opposite directions. In this way, a differential voltage $V0$ (namely, an induced voltage $V1$ of the reference coil 6 minus an induced voltage $V2$ of the detection coil 4) is input to the amplifier circuit 12.

The other end of the detection coil 4 is connected to the amplifier circuit 12 via the capacitor 14, and the other end of the reference coil 6 is connected to the amplifier circuit 12 via the resistor 13. The resistor 13 is connected to a base of a bipolar transistor in the amplifier circuit 12 and is used for setting the amplification factor of the amplifier circuit 12.

The capacitor 14 has the function of cutting a DC component of the differential voltage $V0$. In this way, only an AC component of the differential voltage $V0$ is input to the amplifier circuit 12.

An operation of the magnetic permeability sensor 3 is briefly described. The drive current generated in the oscillation circuit 11 flows in the first drive coil 5 and the second drive coil 7, the induced voltage $V1$ is generated in the reference coil 6, and the induced voltage $V2$ is generated in the detection coil 4. When toner exists in a vicinity of the detection coil 4, the induced voltage $V2$ is higher than the induced voltage $V1$, and hence the differential voltage $V0$ is not 0 V. The magnetic permeability sensor 3 amplifies the differential voltage $V0$ with the amplifier circuit 12 and uses an output signal from the amplifier circuit 12 so as to detect a remaining toner amount.

First Embodiment

Figure 4:
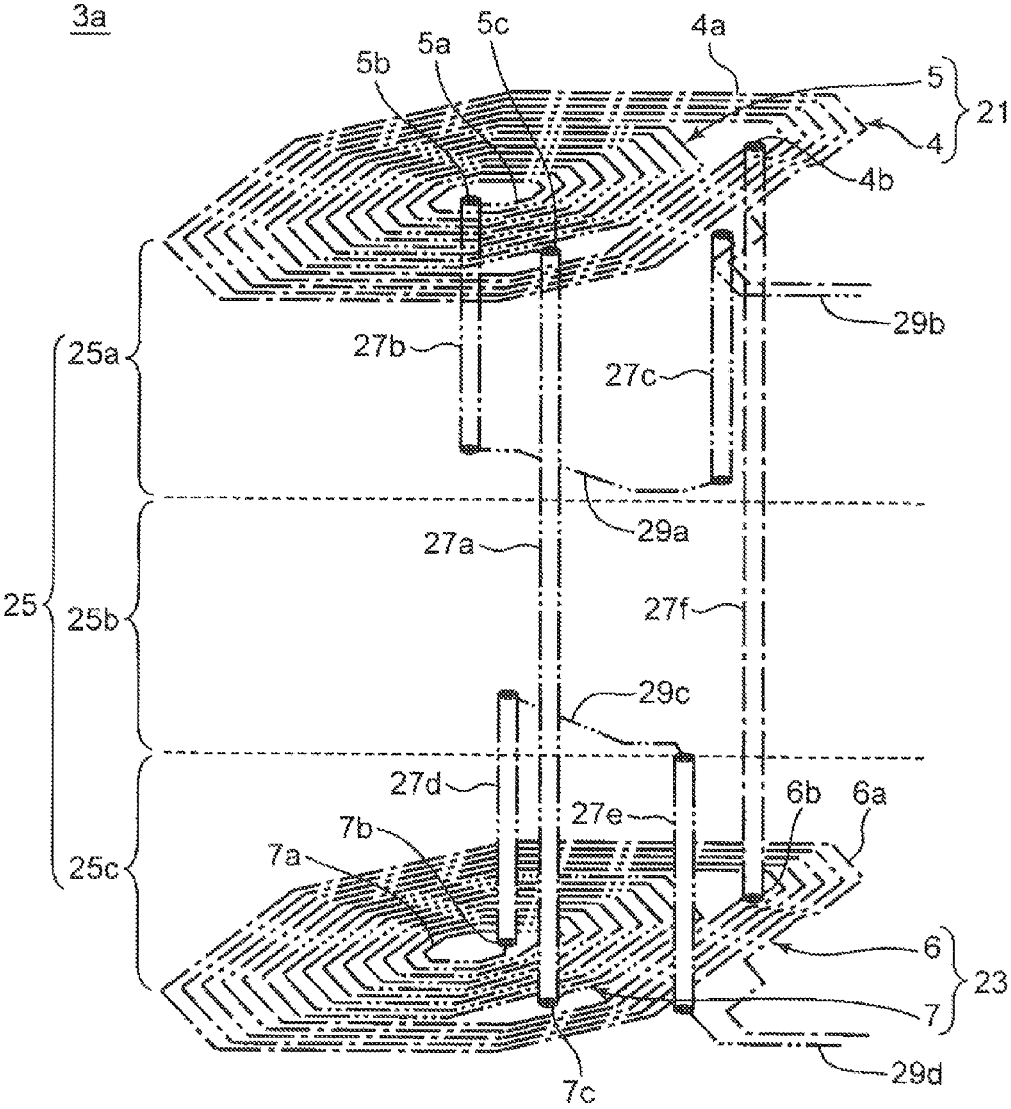
FIG. 4 is a perspective view illustrating a structure of the differential transformer magnetic permeability sensor according to a first embodiment of the present disclosure.
Figure 5:
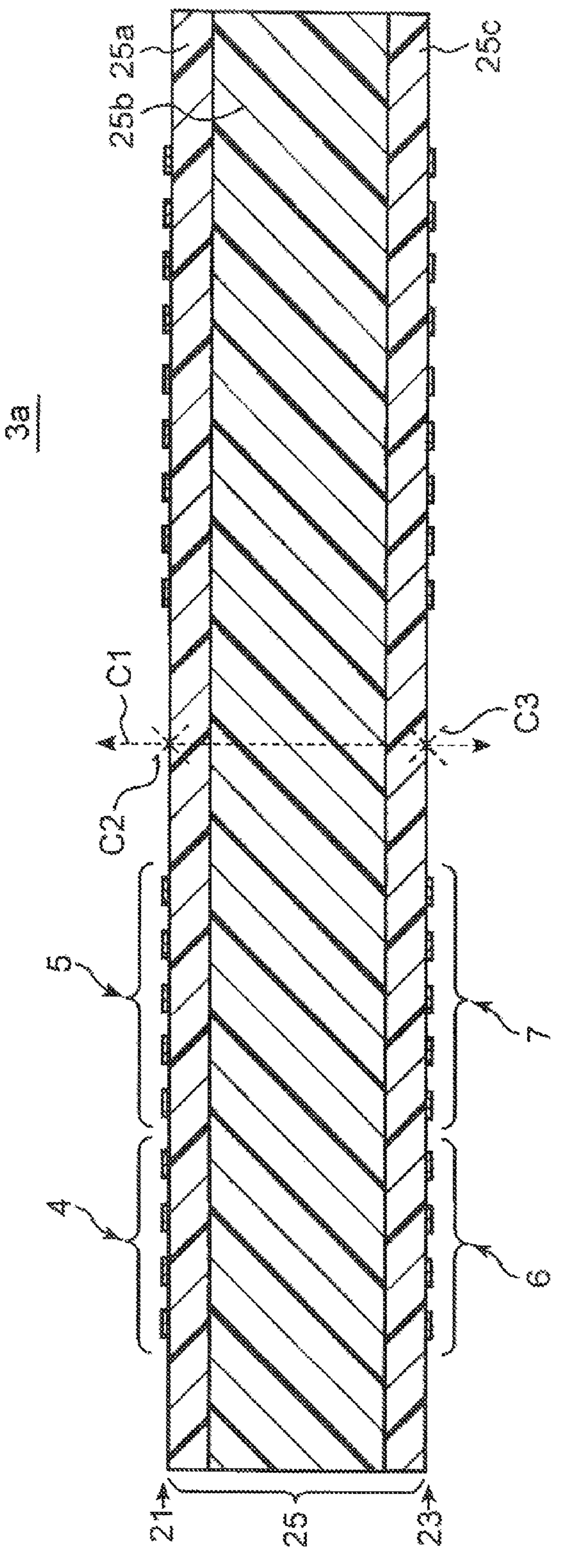
FIG. 5 is a cross-sectional view of the differential transformer magnetic permeability sensor according to the first embodiment of the present disclosure.

Next, with reference to FIGS. 4, 5, and 8, there is described a differential transformer magnetic permeability sensor 3*a* according to a first embodiment of the present disclosure, which can be used as the magnetic permeability sensor 3 (hereinafter referred to as a magnetic permeability sensor 3*a*). FIG. 4 is a perspective view illustrating a structure of the magnetic permeability sensor 3*a*. FIG. 5 is a cross-sectional view of the magnetic permeability sensor 3*a*.

The magnetic permeability sensor 3*a* includes a first coil layer 21, a second coil layer 23, and a first insulating layer 25.

The first coil layer 21 is constituted of a first wire 5*a* and a second wire 4*a*. The first wire 5*a* and the second wire 4*a* are on the same plane (on a surface of an upper insulating film 25*a*) and are flat windings in a spiral shape.

The first wire 5*a* is patterned to start from a terminal 5*b* and to extend spirally to increase its radius in a counter-clockwise direction viewed from the first coil layer 21 side of the magnetic permeability sensor 3*a*. The first wire 5*a* constitutes the first drive coil 5 as a planar coil.

The second wire 4*a* is patterned to start from a terminal 4*b* positioned outside the first drive coil 5 and to extend spirally to increase its radius in a clockwise direction viewed from the first coil layer 21 side of the magnetic permeability sensor 3*a*, and to be concentric with the first drive coil 5. In other words, the second wire 4*a* is a flat winding around the first drive coil 5 so as to be concentric with the first drive coil 5. The second wire 4*a* constitutes the detection coil 4 as a planar coil.

The second coil layer 23 is constituted of a third wire 7*a* and a fourth wire 6*a*. The third wire 7*a* and the fourth wire 6*a* are on the same plane (on a surface of a lower insulating film 25*c*) and are flat windings in a spiral shape.

The third wire 7*a* is patterned to start from a terminal 7*b* and to extend spirally to increase its radius in a clockwise direction viewed from the first coil layer 21 side of the magnetic permeability sensor 3*a*. The third wire 7*a* constitutes the second drive coil 7 as a planar coil.

The fourth wire 6*a* is patterned to start from a terminal 6*b* positioned outside the second drive coil 7 and to extend spirally to increase its radius in a clockwise direction viewed from the first coil layer 21 side of the magnetic permeability sensor 3*a*, and to be concentric with the second drive coil 7. In other words, the fourth wire 6*a* is a flat winding around the second drive coil 7 so as to be concentric with the second drive coil 7. The fourth wire 6*a* constitutes the reference coil 6 as a planar coil.

The insulating layer 25 is disposed between the first coil layer 21 and the second coil layer 23. The insulating layer 25 includes the upper insulating film 25*a*, an intermediate insulating film 25*b*, and the lower insulating film 25*c*.

The first coil layer 21 is formed on a surface of the upper insulating film 25*a*. The second coil layer 23 is formed on a surface of the lower insulating film 25*c*. The intermediate insulating film 25*b* is formed between the upper insulating film 25*a* and the lower insulating film 25*c*. In the first embodiment, the insulating layer 25 functions as the first insulating layer.

The first drive coil 5 and the second drive coil 7 are electrically connected so that drive current flowing in the first drive coil 5 and drive current flowing in the second drive coil 7 have the same direction. In order to realize this, a terminal 5*c* of the first drive coil 5 and a terminal 7*c* of the second drive coil 7 are electrically connected.

In more detail, a connection plug 27*a* is formed to penetrate the insulating layer 25. The terminal 5*c* of the first drive coil 5 is electrically connected to the connection plug 27*a*. The terminal 7*c* of the second drive coil 7 is electrically connected to the connection plug 27*a*. In this way, the terminal 5*c* of the first drive coil 5 and the terminal 7*c* of the second drive coil 7 are electrically connected via the connection plug 27*a*.

However, the terminal 5*b* of the first drive coil 5 is positioned inside the first drive coil 5, and hence a wiring for connecting the terminal 5*b* to the oscillation circuit 11 (FIG. 3) cannot be formed in the first coil layer 21.

Accordingly, a wiring 29*a* is formed on the intermediate insulating film 25*b*, and connection plugs 27*b* and 27*c* are formed to penetrate the upper insulating film 25*a*. Further, the wiring 29*a* and the terminal 5*b* are electrically connected via the connection plug 27*b*, and a wiring 29*b* connected to the oscillation circuit 11 (FIG. 3) and the wiring 29*a* are electrically connected via the connection plug 27*c*. In this way, using the wiring 29*a* and the connection plugs 27*b* and 27*c*, the wiring 29*b* connected to the oscillation circuit 11 (FIG. 3) and the terminal 5*b* are electrically connected.

In the same manner, the terminal 7*b* of the second drive coil 7 is positioned inside the second drive coil 7, and hence a wiring for connecting the terminal 7*b* to the oscillation circuit 11 (FIG. 3) cannot be formed in the second coil layer 23.

Accordingly, a wiring 29*c* is formed on the lower insulating film 25*c*, and connection plugs 27*d* and 27*e* are formed to penetrate the lower insulating film 25*c*. Further, the wiring 29*c* and the terminal 7*b* are electrically connected via the connection plug 27*d*, and a wiring 29*d* connected to the oscillation circuit 11 (FIG. 3) and the wiring 29*c* are electrically connected via the connection plug 27*e*. In this way, using the wiring 29*c* and the connection plugs 27*d* and 27*e*, the wiring 29*d* connected to the oscillation circuit 11 (FIG. 3) and the terminal 7*b* are electrically connected.

In addition, the detection coil 4 and the reference coil 6 are electrically connected so that induced current flowing in the detection coil 4 and induced current flowing in the reference coil 6 have opposite directions. In order to realize this, the terminal 4*b* of the detection coil 4 and the terminal 6*b* of the reference coil 6 are electrically connected via a connection plug 27*f* formed to penetrate the insulating layer 25.

As illustrated in FIG. 5, when no position shift occurs in forming the detection coil 4, the first drive coil 5, the reference coil 6, and the second drive coil 7, the detection coil 4 and the first drive coil 5 are formed in a concentric manner, while the reference coil 6 and the second drive coil 7 are formed in a concentric manner. In other words, a center C2 of the detection coil 4 and a center C3 of the reference coil 6 are positioned at a center C1 of the magnetic flux generated when drive current flows in the first drive coil 5 and the second drive coil 7.

In the magnetic permeability sensor 3*a* according to the first embodiment, the first wire 5*a* is a flat winding in a spiral shape in the opposite direction to the second wire 4*a*, while the third wire 7*a* and the fourth wire 6*a* are flat windings in a spiral shape in the same direction. However, it is possible to adopt a structure in which the first wire 5*a* and the second wire 4*a* are flat windings in a spiral shape in the same direction, while the third wire 7*a* is a flat winding in a spiral shape in the opposite direction to the fourth wire 6*a* (the first coil layer 21 and the second coil layer 23 are exchanged in FIG. 4).

Figure 6:
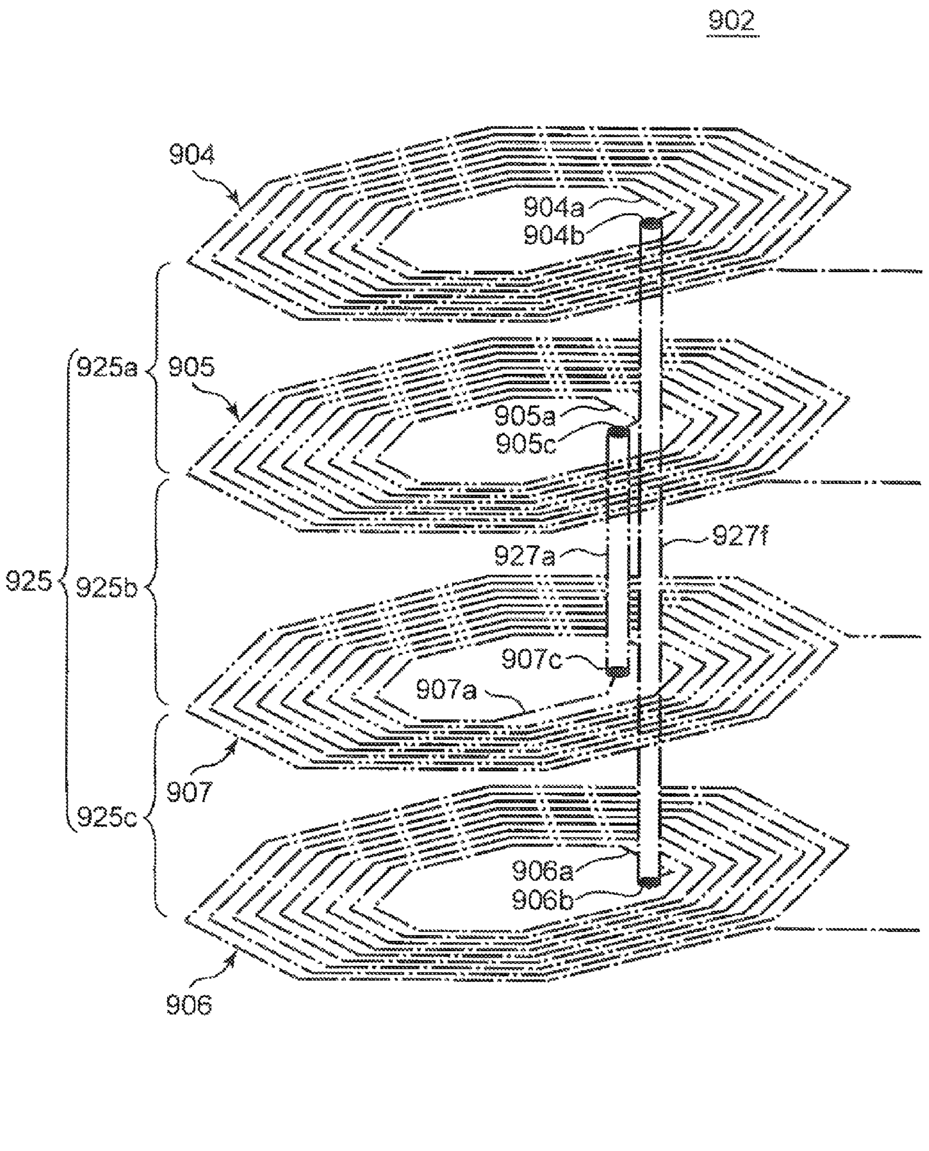
FIG. 6 is a perspective view illustrating a structure of the differential transformer magnetic permeability sensor according to a comparative example.
Figure 7A:
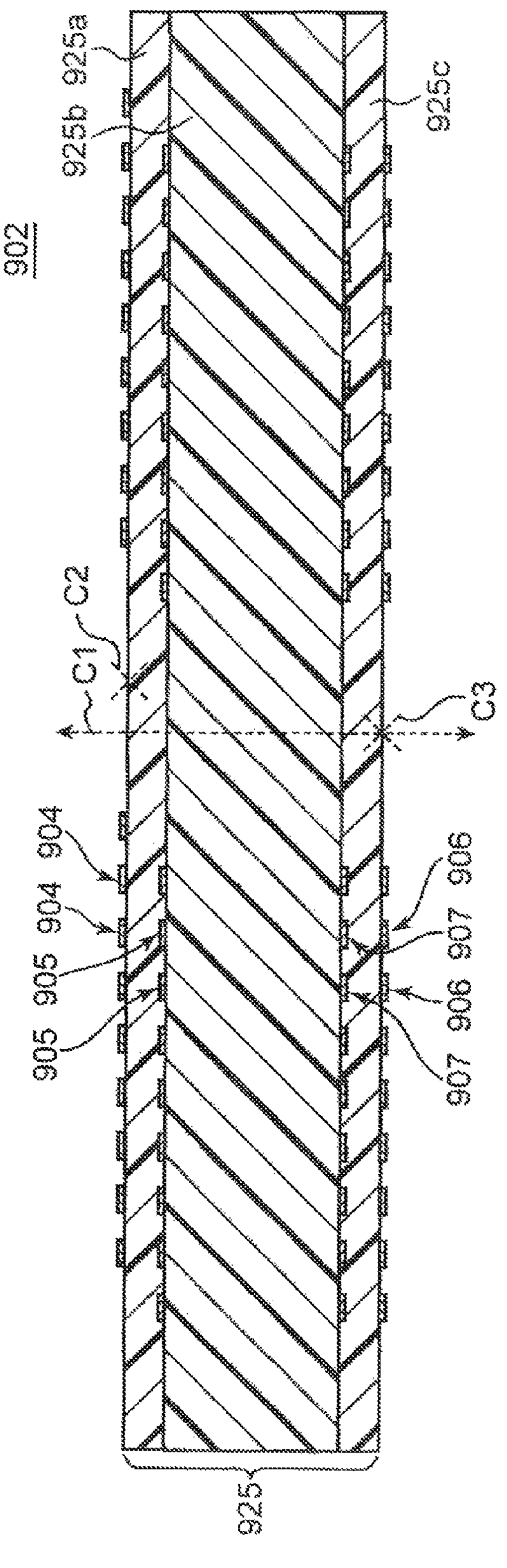
FIG. 7A is a diagram illustrating an example of a cross section of the differential transformer magnetic permeability sensor according to the comparative example in a state where a position shift occurs in forming a detection coil.
Figure 7B:
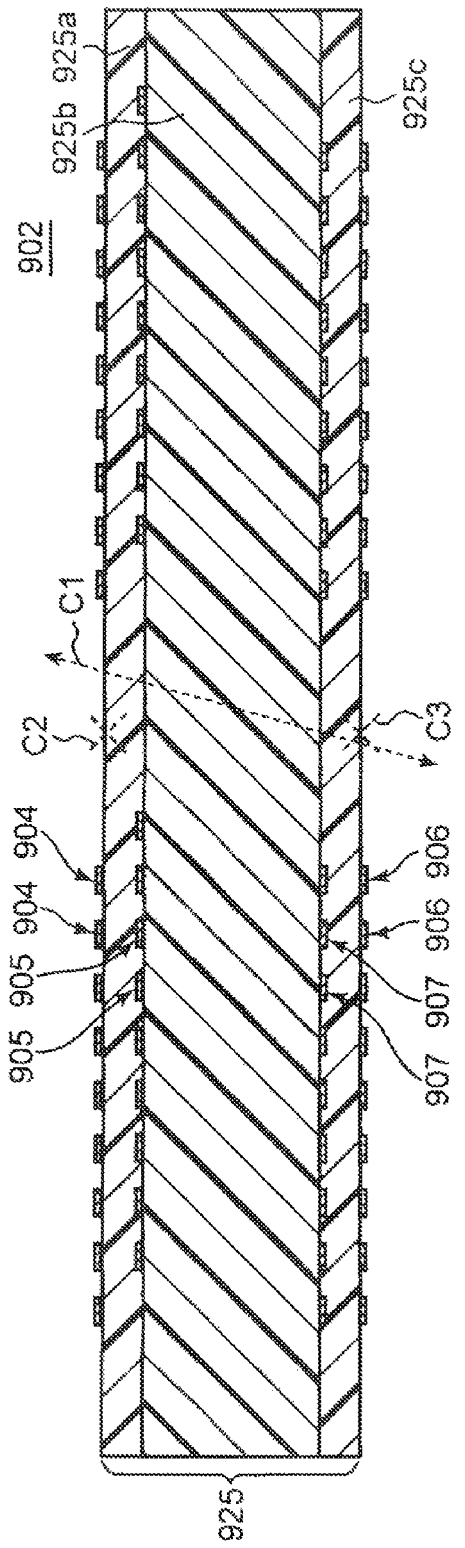
FIG. 7B is a diagram illustrating an example of a cross section of the differential transformer magnetic permeability sensor according to the comparative example in a state where a position shift occurs in forming a first drive coil.

The effect of the magnetic permeability sensor 3*a* according to the first embodiment is described in comparison with a differential transformer magnetic permeability sensor 902 of a comparative example with reference to FIGS. 6, 7A, and 7B. Among elements constituting the differential transformer magnetic permeability sensor 902 according to the comparative example, the same element as that constituting the magnetic permeability sensor 3*a* according to the first embodiment is denoted by the same numeral except digit of hundreds.

FIG. 6 is a perspective view illustrating a structure of the differential transformer magnetic permeability sensor 902 according to the comparative example. In the magnetic permeability sensor 902 of the comparative example, a first drive coil 905 is formed between an upper insulating film 925*a* and an intermediate insulating film 925*b*. A second drive coil 907 is formed between the intermediate insulating film 925*b* and a lower insulating film 925*c*. In other words, the first drive coil 905 is formed in another layer different from a detection coil 904. The second drive coil 907 is formed in another layer different from a reference coil 906.

A terminal 905*c* of the first drive coil 905 and a terminal 907*c* of the second drive coil 907 are electrically connected via a connection plug 927*a* formed to penetrate the intermediate insulating film 925*b*. In this way, drive current flowing in the first drive coil 905 and drive current flowing in the second drive coil 907 have the same direction.

A terminal 904*b* of the detection coil 904 and a terminal 906*b* of the reference coil 906 are electrically connected via a connection plug 927*f* formed to penetrate the insulating layer 925. In this way, induced current flowing in the detection coil 904 and induced current flowing in the reference coil 6 have opposite directions.

FIGS. 7A and 7B are diagrams illustrating examples of cross sections of the differential transformer magnetic permeability sensor 902 according to the comparative example illustrated in FIG. 6 in the state where a position shift occurs in forming coils. FIG. 7A is an example in which a position shift occurs in forming the detection coil 904, and FIG. 7B is an example in which a position shift occurs in forming the first drive coil 905.

When a position shift occurs in forming the detection coil 904 or the first drive coil 905, in a state where there is no toner (magnetic substance) to be detected, an amount of magnetic flux passing through the detection coil 904 becomes smaller than an amount of magnetic flux passing through the reference coil 906. Thus, the amount of magnetic flux passing through the detection coil 904 is not equal to the amount of magnetic flux passing through the reference coil 906. In other words, in a state where there is no toner to be detected, induced current flowing in the detection coil 904 becomes smaller than induced current flowing in reference coil 906, and hence the induced current flowing in the detection coil 904 is not equal to the induced current flowing in the reference coil 906. When the position shift in forming a coil is different in each magnetic permeability sensor 902, the difference between the amount of magnetic flux passing through the detection coil 904 and the amount of magnetic flux passing through the reference coil 906 has a variation, and hence the output differs in each magnetic permeability sensor 902. As a result, accuracy of measurement is deteriorated.

Figure 8:
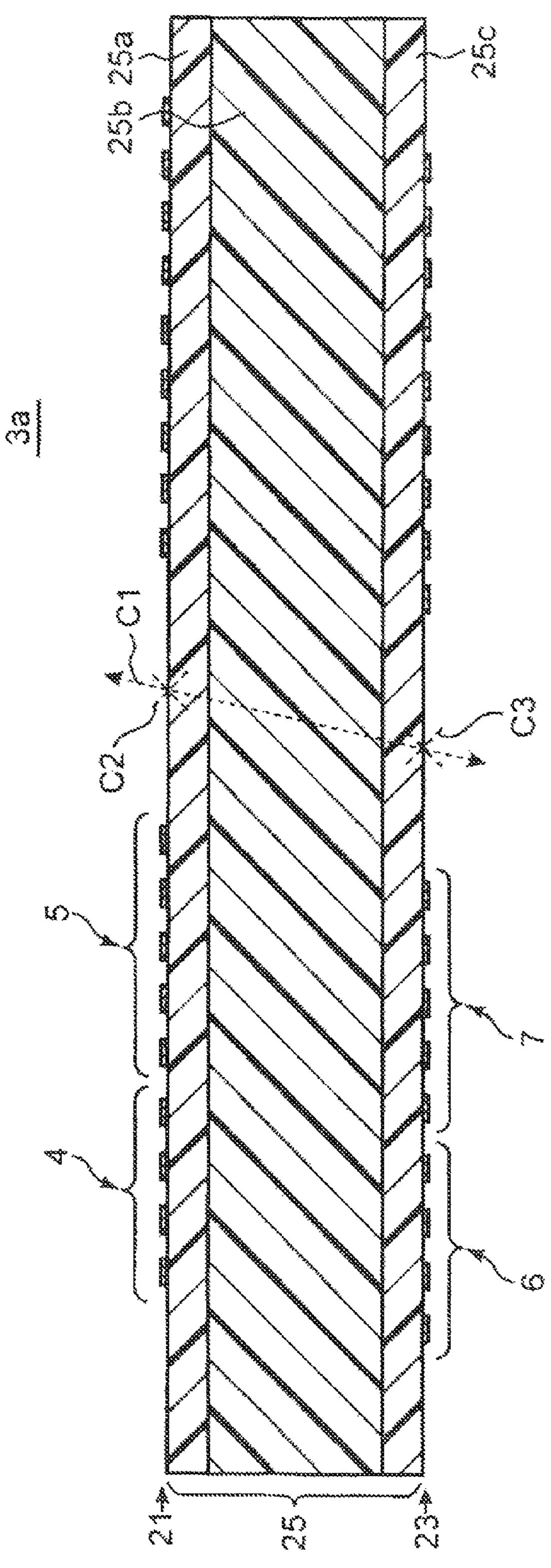
FIG. 8 is a diagram illustrating an example of a cross section of the differential transformer magnetic permeability sensor according to the first embodiment in a state where a position shift occurs in forming a coil.

FIG. 8 is a diagram illustrating an example of a cross section of the magnetic permeability sensor 3*a* according to the first embodiment in a state where a position shift occurs in forming a coil. FIG. 5 is a diagram illustrating an example of a cross section of the magnetic permeability sensor 3*a* according to the first embodiment in a state where no position shift occurs in forming a coil. As understood from comparison between FIG. 5 and FIG. 8, a position shift is generated in forming the detection coil 4 and the first drive coil 5 as illustrated in FIG. 8.

As described above, in the magnetic permeability sensor 3*a* according to the first embodiment, the detection coil 4 and the first drive coil 5 are included in the first coil layer 21 and are formed in a concentric manner in the same layer. Accordingly, when the detection coil 4 and the first drive coil 5 are formed in the first coil layer 21, even if a position shift occurs in forming one of the coils, the same amount of position shift occurs in forming the other coil, and hence there is no change in the relative positional relationship between the detection coil 4 and the first drive coil 5. Accordingly, even if a position shift occurs in forming the detection coil 4 and the first drive coil 5, amount of magnetic flux passing through the detection coil 4 does not change in the state where there is no object to be detected.

In the same manner, the reference coil 6 and the second drive coil 7 are included in the second coil layer 23 and are formed in a concentric manner in the same layer. Accordingly, when the reference coil 6 and the second drive coil 7 are formed in the second coil layer 23, even if a position shift occurs in forming one of the coils, the same amount of position shift occurs in forming the other coil, and hence there is no change in the relative positional relationship between the reference coil 6 and the second drive coil 7. Accordingly, even if a position shift occurs in forming the reference coil 6 and the second drive coil 7, the amount of magnetic flux passing through the reference coil 6 does not change in the state where there is no object to be detected.

In addition, the magnetic permeability sensor 3*a* has a structure in which the distance between the wire 4*a* forming the detection coil 4 and the wire 5*a* forming the first drive coil 5 arranged in parallel is shorter than in a case where the wire 4*a* forming the detection coil 4 and the wire 5*a* forming the first drive coil 5 are formed in parallel as flat windings. In other words, the capacitance between the detection coil 4 and the first drive coil 5 is smaller than in the case where the wire 4*a* forming the detection coil 4 and the wire 5*a* forming the first drive coil 5 are formed in parallel as flat windings. Accordingly, it is possible to reduce a possibility that a voltage variation of the first drive coil 5 causes a voltage variation of the detection coil 4 due to the capacitance between the first drive coil 5 and the detection coil 4.

In the same manner, the magnetic permeability sensor 3*a* has a structure in which a distance between the wire 6*a* forming the reference coil 6 and the wire 7*a* forming the second drive coil 7 arranged in parallel is shorter than in a case where the wire 6*a* forming the reference coil 6 and the wire 7*a* forming the second drive coil 7 are formed in parallel as flat windings. In other words, the capacitance between the reference coil 6 and the second drive coil 7 is smaller than in the case where the wire 6*a* forming the reference coil 6 and the wire 7*a* forming the second drive coil 7 are formed in parallel as flat windings. Accordingly, it is possible to reduce a possibility that a voltage variation of the second drive coil 7 causes a voltage variation of the reference coil 6 due to the capacitance between the second drive coil 7 and the reference coil 6.

As described above, according to the first embodiment, even if a position shift occurs in forming the detection coil 4, the first drive coil 5, the reference coil 6, and the second drive coil 7 as planar coils, in the state where there is no object to be detected, the amount of magnetic flux passing through the detection coil 4 or the amount of magnetic flux passing through the reference coil 6 does not change. In addition, a possibility that voltage variations of the first drive coil 5 and the second drive coil 7 cause voltages variation of the detection coil 4 and the reference coil 6 can be reduced. In this way, it is possible to prevent that the difference between the amount of magnetic flux passing through the detection coil 4 and the amount of magnetic flux passing through the reference coil 6 differs in each magnetic permeability sensor 3*a*, in the state where there is no object to be detected. Thus, a variation of the output level of each magnetic permeability sensor 3*a* can be suppressed with high accuracy.

Second Embodiment

Next, with reference to FIGS. 9 and 10, a differential transformer magnetic permeability sensor 3*b* according to the second embodiment (hereinafter referred to as a magnetic permeability sensor 3*b*) is described mainly about a difference to the magnetic permeability sensor 3*a* according to the first embodiment. The first coil layer 21 and the second coil layer 23 are formed one for each in the first embodiment, but two first coil layers 21 and two second coil layers 23 are formed in the second embodiment.

Further, although the example of a structure in which two first coil layers 21 and second coil layers 23 are formed is described here, the second embodiment can be also applied to a case where three or more first coil layers 21 and second coil layers 23 each are formed. In this case, the plurality of first coil layers 21 are formed in an alternate manner with the insulating layers (second insulating layers), and hence the each insulating layer (second insulating layer) is sandwiched between two first coil layers 21 among the plurality of first coil layers 21. In addition, the plurality of second coil layers 23 are formed in an alternate manner with the insulating layers (third insulating layers), and hence the each insulating layer (third insulating layer) is sandwiched between two second coil layers 23 among the plurality of second coil layers 23. In addition, it is preferred that the number of the first coil layers 21 is a plural number and is equal to the number of the second coil layers 23. Further, among the elements constituting the magnetic permeability sensor 3*b* according to the second embodiment, the same element as that constituting the magnetic permeability sensor 3*a* according to the first embodiment is denoted by the same numeral.

Figure 9:
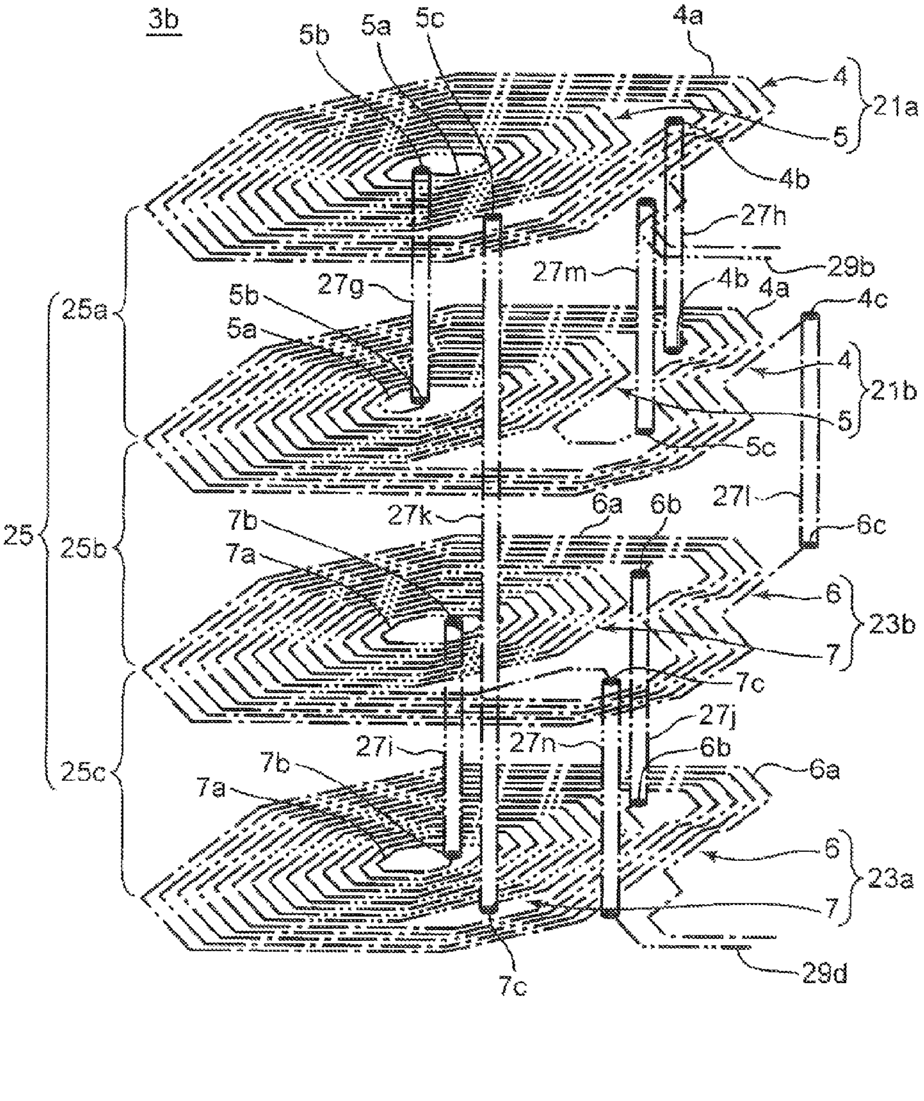
FIG. 9 is a perspective view illustrating a structure of the differential transformer magnetic permeability sensor according to a second embodiment of the present disclosure.

FIG. 9 is a perspective view illustrating a structure of the magnetic permeability sensor 3*b*. Each of a first coil layer 21*a* and a first coil layer 21*b* includes the detection coil 4 and the first drive coil 5. Each of a second coil layer 23*a* and a second coil layer 23*b* includes the reference coil 6 and the second drive coil 7.

The first coil layer 21*a* is formed on an upper surface of the upper insulating film 25*a*. The first coil layer 21*b* is formed between the upper insulating film 25*a* and the intermediate insulating film 25*b*. The second coil layer 23*b* is formed between the intermediate insulating film 25*b* and the lower insulating film 25*c*. The second coil layer 23*a* is formed on a lower surface of the lower insulating film 25*c* (namely, on a surface opposite to the surface on which the second coil layer 23*b* is formed out of surfaces of the lower insulating film 25*c*).

In view of the upper insulating film 25*a* and the lower insulating film 25*c*, the upper insulating film 25*a* is formed between the first coil layer 21*a* and the first coil layer 21*b* (the upper insulating film 25*a* is formed on one surface of the intermediate insulating film 25*b* so as to be sandwiched between the first coil layers 21*a* and 21*b*). The lower insulating film 25*c* is formed between the second coil layer 23*a* and the second coil layer 23*b* (the lower insulating film 25*c* is formed on the other surface of the intermediate insulating film 25*b* so as to be sandwiched between the second coil layers 23*a* and 23*b*). In the second embodiment, the intermediate insulating film 25*b* functions as the first insulating layer, the upper insulating film 25*a* functions as the second insulating layer, and the lower insulating film 25*c* functions as the third insulating layer.

In the magnetic permeability sensor 3*b*, the first coil layer 21*a*, the upper insulating film 25*a*, the first coil layer 21*b*, the intermediate insulating film 25*b*, the second coil layer 23*b*, the lower insulating film 25*c*, and the second coil layer 23*a* are formed in this order.

The first coil layer 21*a* and the first coil layer 21*b* are different in the direction of winding. In the first coil layer 21*a*, the first wire 5*a* is patterned start from the terminal 5*b* and to extend spirally to increase its radius in a counterclockwise direction viewed from the first coil layer 21*a* side of the magnetic permeability sensor 3*b*. The first wire 5*a* constitutes the first drive coil 5 as a planar coil. The second wire 4*a* is patterned to start from the terminal 4*b* positioned outside the first drive coil 5 and to extend spirally to increase its radius in a clockwise direction viewed from the first coil layer 21*a* side of the magnetic permeability sensor 3*b*, and to be concentric with the first drive coil 5. The second wire 4*a* constitutes the detection coil 4 as a planar coil.

On the other hand, in the first coil layer 21*b*, the first wire 5*a* is patterned to start from the terminal 5*b* and to extend spirally to increase its radius in a clockwise direction viewed from the first coil layer 21*a* side of the magnetic permeability sensor 3*b*. The first wire 5*a* constitutes the first drive coil 5 as a planar coil. The second wire 4*a* is patterned to start from the terminal 4*b* positioned outside the first drive coil 5 and to extend spirally to increase its radius in a counterclockwise direction viewed from the first coil layer 21*a* side of the magnetic permeability sensor 3*b*, and to be concentric with the first drive coil 5. The second wire 4*a* constitutes the detection coil 4 as a planar coil.

The second coil layer 23*a* and the second coil layer 23*b* are different in the direction of winding. In the second coil layer 23*a*, the third wire 7*a* is patterned start from the terminal 7*b* and to extend spirally to increase its radius in a clockwise direction viewed from the first coil layer 21*a* side of the magnetic permeability sensor 3*b*. The third wire 7*a* constitutes the second drive coil 7 as a planar coil. The fourth wire 6*a* is patterned to start from the terminal 6*b* positioned outside the second drive coil 7 and to extend spirally to increase its radius in a clockwise direction viewed from the first coil layer 21*a* side of the magnetic permeability sensor 3*b*, and to be concentric with the second drive coil 7. The fourth wire 6*a* constitutes the reference coil 6 as a planar coil.

On the other hand, in the second coil layer 23*b*, the third wire 7*a* is patterned to start from the terminal 7*b* and to extend spirally to increase its radius in a counterclockwise direction viewed from the first coil layer 21*a* side of the magnetic permeability sensor 3*b*. The third wire 7*a* constitutes the second drive coil 7 as a planar coil. The fourth wire 6*a* is patterned to start from the terminal 6*b* positioned outside the second drive coil 7 and to extend spirally to increase its radius in a counterclockwise direction viewed from the first coil layer 21*a* side of the magnetic permeability sensor 3*b*. The fourth wire 6*a* constitutes the reference coil 6 as a planar coil.

In the first coil layers 21*a* and 21*b*, the first drive coils 5 are electrically connected in a single stroke manner so that drive current flowing in the first drive coils 5 have the same direction. In order to realize this, the terminal 5*b* of the first drive coil 5 in the first coil layer 21*a* and the terminal 5*b* of the first drive coil 5 in the first coil layer 21*b* are electrically connected via a connection plug 27*g* formed to penetrate the upper insulating film 25*a*.

In the first coil layers 21*a* and 21*b*, the detection coils 4 are electrically connected in a single stroke manner so that induced current flowing in the detection coils 4 have the same direction. In order to realize this, the terminal 4*b* of the detection coil 4 in the first coil layer 21*a* and the terminal 4*b* of the detection coil 4 in the first coil layer 21*b* are electrically connected via a connection plug 27*h* formed to penetrate the upper insulating film 25*a*.

In the second coil layers 23*a* and 23*b*, the second drive coils 7 are electrically connected in a single stroke manner so that drive current flowing in the second drive coils 7 have the same direction. In order to realize this, the terminal 7*b* of second drive coil 7 in the second coil layer 23*a* and the terminal 7*b* of the second drive coil 7 in the second coil layer 23*b* are electrically connected via a connection plug 27*i* formed to penetrate the lower insulating film 25*c*.

In the second coil layers 23*a* and 23*b*, the reference coils 6 are electrically connected in a single stroke manner so that induced current flowing in the reference coils 6 have the same direction. In order to realize this, the terminal 6*b* of the reference coil 6 in the second coil layer 23*a* and the terminal 6*b* of the reference coil 6 in the second coil layer 23*b* are electrically connected via a connection plug 27*j* formed to penetrate the lower insulating film 25*c*.

The terminal 5*c* of the first drive coil 5 in the first coil layer 21*a* is positioned outside the first drive coil 5. The terminal 7*c* of the second drive coil 7 in the second coil layer 23*a* is positioned outside the second drive coil 7. The terminal 5*c* and the terminal 7*c* are electrically connected via a connection plug 27*k* formed to penetrate the insulating layer 25. In this way, drive current flowing in the first drive coil 5 and drive current flowing in the second drive coil 7 have the same direction.

The terminal 4*c* of the detection coil 4 in the first coil layer 21*b* is positioned outside the detection coil 4. The terminal 6*c* of the reference coil 6 in the second coil layer 23*b* is positioned outside the reference coil 6. The terminal 4*c* and the terminal 6*c* are electrically connected via a connection plug 27I formed to penetrate the intermediate insulating film 25*b*. In this way, induced current flowing in the detection coil 4 and induced current flowing in the reference coil 6 have opposite directions.

In addition, on order to connect the oscillation circuit 11 (FIG. 3) to the first drive coil 5, the wiring 29*b* connected to the oscillation circuit 11 (FIG. 3) and the terminal 5*c* outside the first drive coil 5 in the first coil layer 21*b* are electrically connected via a connection plug 27*m* formed to penetrate the upper insulating film 25*a*. In addition, in order to connect the oscillation circuit 11 to the second drive coil 7, the wiring 29*d* connected to the oscillation circuit 11 and the terminal 7*c* outside the second drive coil 7 in the second coil layer 23*b* are electrically connected via a connection plug 27*n* formed to penetrate the lower insulating film 25*c*.

According to the second embodiment, the two first coil layer and the two second coil layer are disposed (the first coil layers 21*a* and 21*b*, the second coil layers 23*a* and 23*b*), an output level of the magnetic permeability sensor 3*b* can be increased without increasing an area of the magnetic permeability sensor 3*b*.

In addition, according to the second embodiment, a variation of the output level for each magnetic permeability sensor 3*b* can be reduced. This effect is described in detail with reference to FIG. 10.

Figure 10A:
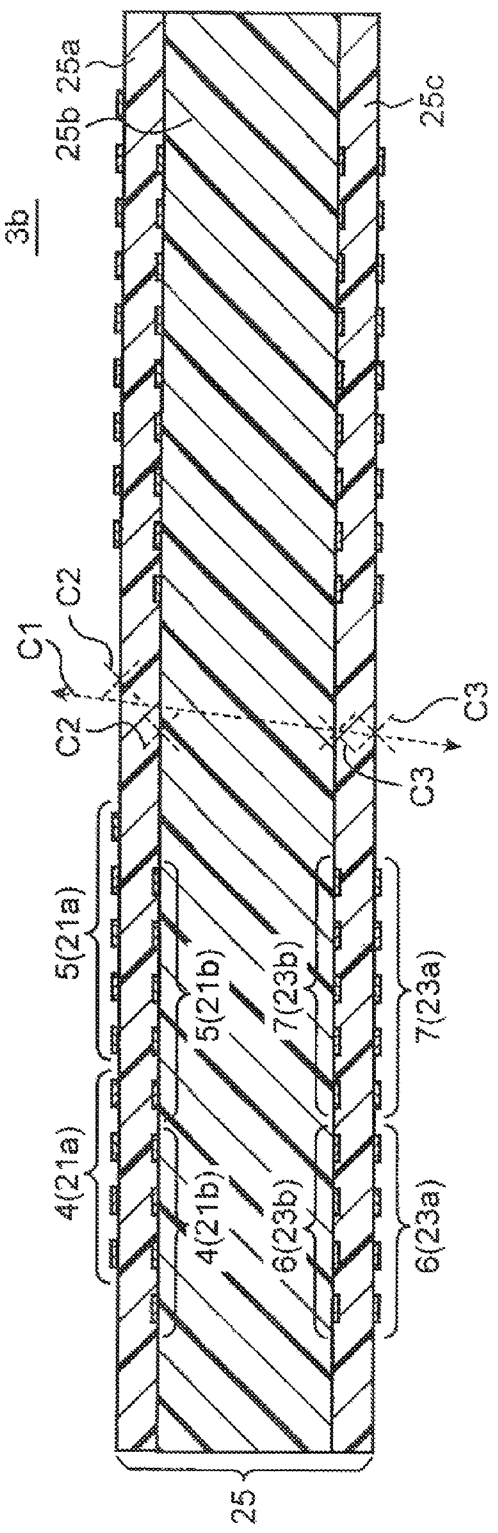
FIG. 10A is a diagram illustrating an example of a cross section of the differential transformer magnetic permeability sensor according to the second embodiment in a state where a position shift occurs in forming one of two first coil layers.
Figure 10B:
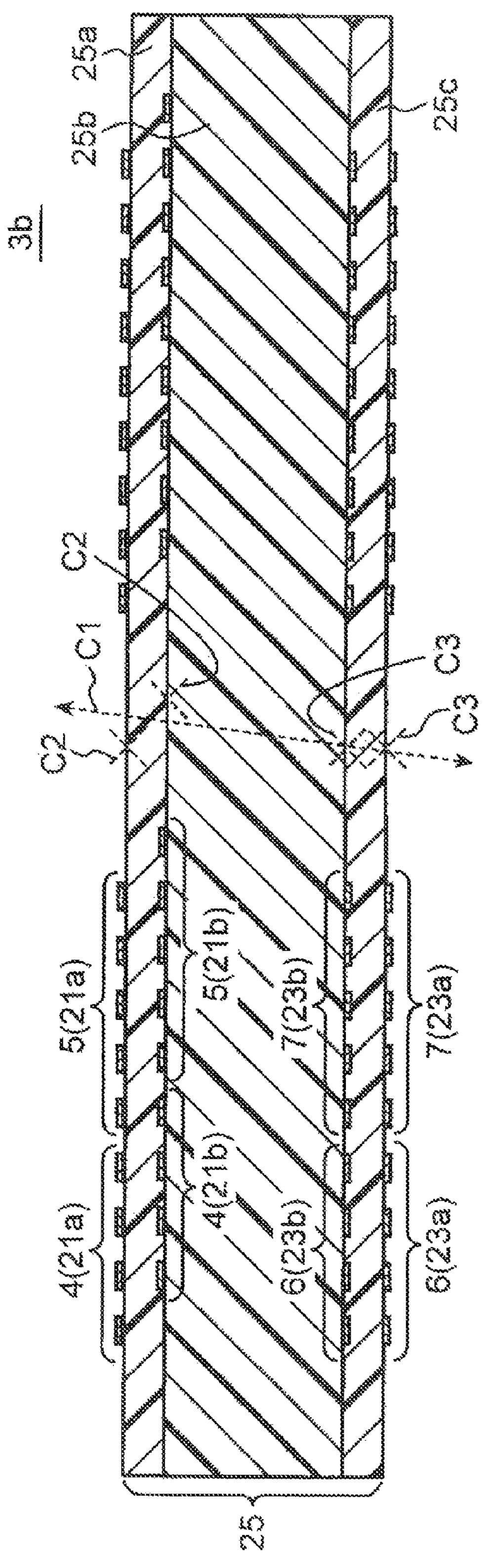
FIG. 10B is a diagram illustrating an example of a cross section of the differential transformer magnetic permeability sensor according to the second embodiment in a state where a position shift occurs in forming the other of the two first coil layers.

FIGS. 10A and 10B are diagrams illustrating examples of the cross section of the magnetic permeability sensor 3*b* according to the second embodiment in a state where a position shift is generated in forming a coil. FIG. 10A illustrates an example in which a position shift is generated in forming the detection coil 4 and the first drive coil 5 in the first coil layer 21*a*. FIG. 10B illustrates an example in which a position shift is generated in forming the detection coil 4 and the first drive coil 5 in the first coil layer 21*b*.

In the second embodiment, a magnetic flux passes through the detection coil 4, which is generated by drive current flowing in the first drive coil 5 in the same layer and the first drive coil 5 in the other layer. In the case of FIG. 10A, in the detection coil 4 in the first coil layer 21*a* in which a position shift is generated, an amount of the passing magnetic flux generated by drive current flowing in the first drive coil 5 in the first coil layer 21*b* in which a position shift is not generated is decreased.

However, as described above in the first embodiment, in the detection coil 4 in the first coil layer 21*a* in which a position shift is generated, an amount of the passing magnetic flux generated by drive current flowing in the first drive coil 5 in the same layer (first coil layer 21*a*) is not changed. Accordingly, compared with the case where a position shift is generated only in forming the detection coil 4 and the first drive coil 5 as the comparative example illustrated in FIGS. 7A and 7B, in the state where there is no object to be detected, an amount of magnetic flux passing through the detection coil 4 and an amount of magnetic flux passing through the reference coil 6 can be reduced. The same is true in the case where a position shift is generated in forming the detection coil 4 and the first drive coil 5 in the first coil layer 21*b* as illustrated in FIG. 10B.

In addition, the same is true for the reference coil 6 similarly to the detection coil 4. A magnetic flux passes through the reference coil 6, which is generated by drive current flowing in the second drive coil 7 in the same layer and the second drive coil 7 in the other layer. Although not illustrated, for example, a case where a position shift occurs in the reference coil 6 and the second drive coil 7 in the second coil layer 23*a* is described. In the reference coil 6 in the second coil layer 23*a*, an amount of passing magnetic flux generated by drive current flowing in the second drive coil 7 in the second coil layer 23*b* in which no position shift is generated is decreased.

However, in the same manner as described above in the first embodiment, in the reference coil 6 in the second coil layer 23*a*, an amount of passing magnetic flux generated by drive current flowing in the second drive coil 7 in the same layer (second coil layer 23*a*) is not changed. Accordingly, compared with a case where a position shift is generated only in forming the reference coil 6 and the second drive coil 7, in the state where there is no object to be detected, a difference between an amount of magnetic flux passing through the detection coil 4 and an amount of magnetic flux passing through the reference coil 6 can be reduced.

As described above, according to the second embodiment, in the case where a position shift is generated in forming the detection coil 4, the first drive coil 5, the reference coil 6, and the second drive coil 7 as planar coils, in the state where there is no object to be detected, a difference between an amount of magnetic flux passing through the detection coil 4 and an amount of magnetic flux passing through the reference coil 6 can be reduced. Accordingly, a variation of the output level for each magnetic permeability sensor 3*b* can be reduced.

Other Embodiments

In addition, the structures illustrated in FIGS. 1 to 5 and 8 to 10 are merely examples of the embodiments of the present disclosure, and the embodiments of the present disclosure are not limited to those.

Figure 11:
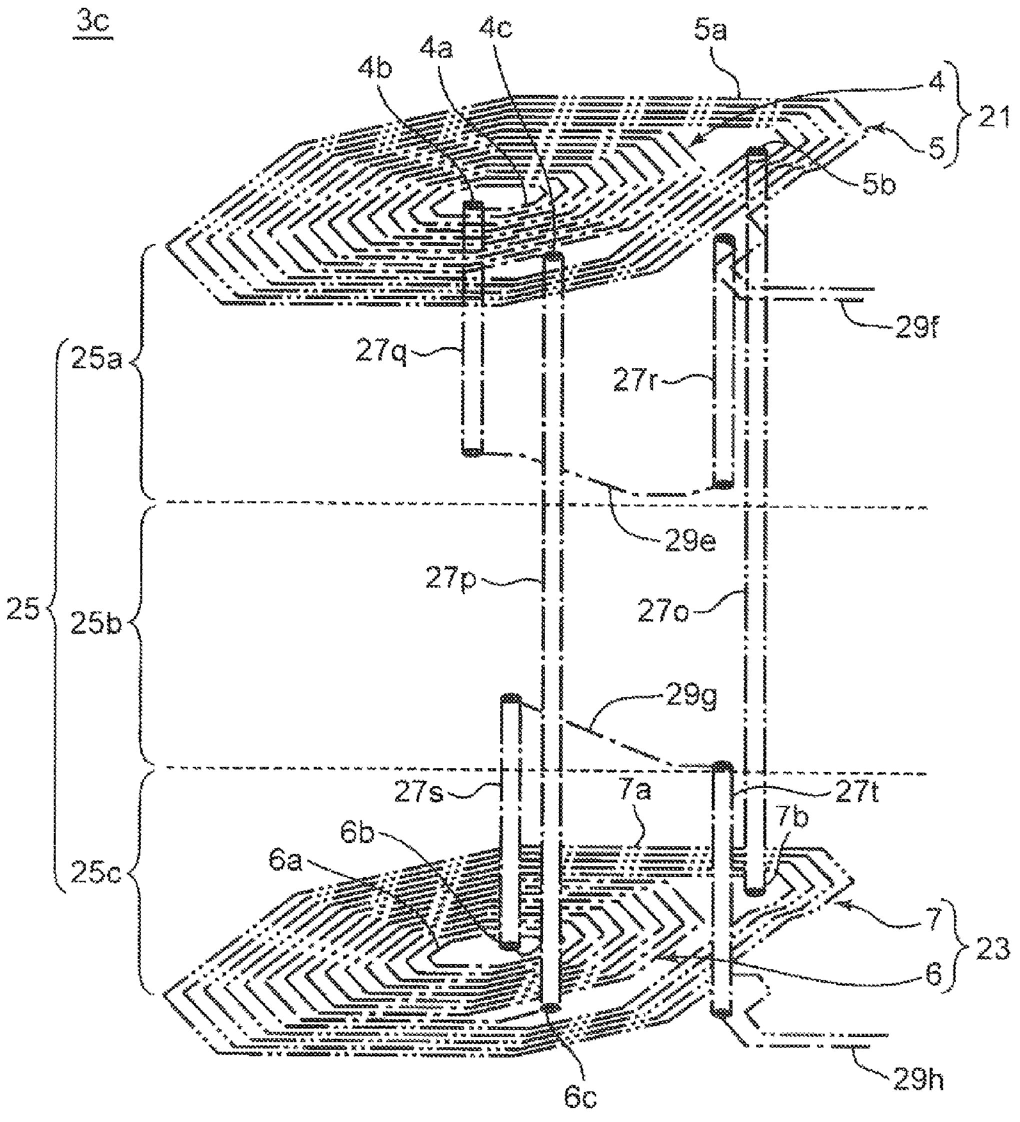
FIG. 11 is a perspective view illustrating a structure of the differential transformer magnetic permeability sensor according to a variation of the first embodiment.

(1) For instance, as illustrated in FIG. 11, as an variation of the first embodiment, it is possible to configure a differential transformer magnetic permeability sensor 3*c* (hereinafter referred to as a magnetic permeability sensor 3*c*), in which positions of forming the detection coil 4 and the first drive coil 5 of the magnetic permeability sensor 3*a* illustrated in FIG. 4 are made to be opposite, and positions of forming the reference coil 6 and the second drive coil 7 are made to be opposite.

FIG. 11 is a perspective view illustrating a structure of the magnetic permeability sensor 3*c* according to the variation of the first embodiment. Further, among elements constituting the magnetic permeability sensor 3*c* according to the variation of the first embodiment, the same element as that constituting the magnetic permeability sensor 3*a* according to the first embodiment is denoted by the same numeral, and description of the element may be omitted.

Specifically, in the first coil layer 21, the second wire 4*a* constituting the detection coil 4 is patterned to start from the terminal 4*b* and to extend spirally to increase its radius in a counterclockwise direction viewed from the first coil layer 21 side of the magnetic permeability sensor 3*c*.

The first wire 5*a* constituting the first drive coil 5 is patterned to start from the terminal 5*b* positioned outside the detection coil 4 and to extend spirally to increase its radius in a clockwise direction viewed from the first coil layer 21 side of the magnetic permeability sensor 3*c*, and to be concentric with the detection coil 4. In other words, in the magnetic permeability sensor 3*c* according to the variation of the first embodiment, the first wire 5*a* is a flat winding outside the detection coil 4 to be concentric with the detection coil 4.

In the second coil layer 23, the fourth wire 6*a* constituting the reference coil 6 is patterned to start from the terminal 6*b* and to extend spirally to increase its radius in a counterclockwise direction viewed from the first coil layer 21 side of the magnetic permeability sensor 3*c*.

The third wire 7*a* constituting the second drive coil 7 is patterned to start from the terminal 7*b* positioned outside the reference coil 6 and to extend spirally to increase its radius in a counterclockwise direction viewed from the first coil layer 21 side of the magnetic permeability sensor 3*c*, and to be concentric with the reference coil 6. In other words, in the magnetic permeability sensor 3*c* according to the variation of the first embodiment, the third wire 7*a* is a flat winding outside the reference coil 6 to be concentric with the reference coil 6.

In addition, the terminal 5*b* of the first drive coil 5 and the terminal 7*b* of the second drive coil 7 are electrically connected via a connection plug 27*o* formed to penetrate the insulating layer 25, so that drive current flowing in the first drive coil 5 and drive current flowing in the second drive coil 7 have the same direction.

In addition, the terminal 4*c* of the detection coil 4 and the terminal 6*c* of the reference coil 6 are electrically connected via a connection plug 27*p* formed to penetrate the insulating layer 25, so that induced current flowing in the detection coil 4 and induced current flowing in the reference coil 6 have opposite directions.

However, the terminal 4*b* of the detection coil 4 is positioned inside the detection coil 4, and hence a wiring for connecting the terminal 4*b* to the amplifier circuit 12 (FIG. 3) via the capacitor 14 (FIG. 3) is not disposed in the first coil layer 21.

Accordingly, a wiring 29*e* is formed on the intermediate insulating film 25*b*, and connection plugs 27*q* and 27*r* are formed to penetrate the upper insulating film 25*a*. Further, the wiring 29*e* and the terminal 4*b* are electrically connected via the connection plug 27*q*, a wiring 29*f* connected to the amplifier circuit 12 (FIG. 3) via the capacitor 14 (FIG. 3) and the wiring 29*e* are electrically connected via the connection plug 27*r*. In this way, using the wiring 29*e* and the connection plugs 27*q* and 27*r*, the wiring 29*f* connected to the amplifier circuit 12 (FIG. 3) via the capacitor 14 (FIG. 3) and the terminal 4*b* are electrically connected to each other.

In the same manner, the terminal 6*b* of the reference coil 6 is positioned inside the reference coil 6, and hence a wiring for connecting the terminal 6*b* to the amplifier circuit 12 (FIG. 3) via the resistor 13 (FIG. 3) cannot disposed in the second coil layer 23.

Accordingly, a wiring 29*g* is formed on the lower insulating film 25*c*, and connection plugs 27*s* and 27*t* are formed to penetrate the lower insulating film 25*c*. Further, the wiring 29*g* and the terminal 6*b* are electrically connected via the connection plug 27*s*, and the wiring 29*h* connected to the amplifier circuit 12 (FIG. 3) via the resistor 13 (FIG. 3) and the wiring 29*g* are electrically connected via the connection plug 27*t*. In this way, using the wiring 29*g* and the connection plugs 27*s* and 27*t*, the wiring 29*h* connected to the amplifier circuit 12 (FIG. 3) via the resistor 13 (FIG. 3) and the terminal 6*b* are electrically connected to each other.

Figure 12:
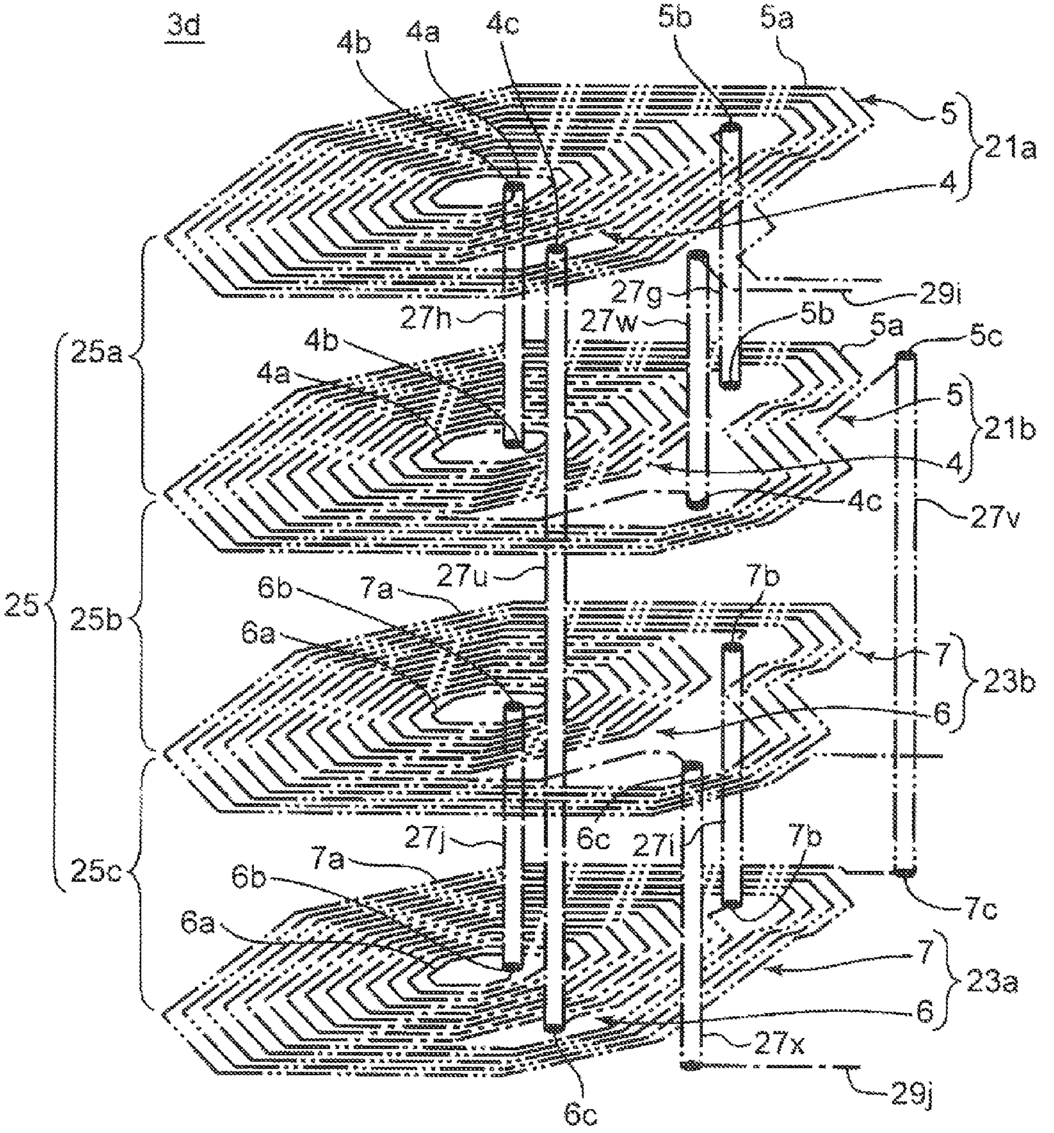
FIG. 12 is a perspective view illustrating a structure of the differential transformer magnetic permeability sensor according to a variation of the second embodiment.

(2) In the same manner, as illustrated in FIG. 12, as a variation of the second embodiment, it is possible to configure a differential transformer magnetic permeability sensor 3*d* (hereinafter referred to as a magnetic permeability sensor 3*d*), in which positions of forming the detection coil 4 and the first drive coil 5 in the first coil layers 21*a* and 21*b* are made to be opposite, and positions of forming the reference coil 6 and the second drive coil 7 in the second coil layers 23*a* and 23*b* are made to be opposite, in the magnetic permeability sensor 3*b* illustrated in FIG. 9.

FIG. 12 is a perspective view illustrating a structure of the magnetic permeability sensor 3*d* according to the variation of the second embodiment. Further, among elements constituting the magnetic permeability sensor 3*d* according to variation of the second embodiment, the same element as that constituting the magnetic permeability sensor 3*b* according to the second embodiment is denoted by the same numeral, and description of the element may be omitted.

Specifically, in the first coil layer 21*a*, the second wire 4*a* constituting the detection coil 4 is patterned to start from the terminal 4*b* and to extend spirally to increase its radius in a clockwise direction viewed from the first coil layer 21*a* side of the magnetic permeability sensor 3*d*. The first wire 5*a* constituting the first drive coil 5 is patterned to start from the terminal 5*b* positioned outside the detection coil 4 and to extend spirally to increase its radius in a clockwise direction viewed from the first coil layer 21*a* side of the magnetic permeability sensor 3*d*, and to be concentric with the detection coil 4.

On the other hand, in the first coil layer 21*b*, the second wire 4*a* constituting the detection coil 4 is patterned to start from the terminal 4*b* and to extend spirally to increase its radius in a counterclockwise direction viewed from the first coil layer 21*a* side of the magnetic permeability sensor 3*d*. The first wire 5*a* constituting the first drive coil 5 is patterned to start from the terminal 5*b* positioned outside the detection coil 4 and to extend spirally to increase its radius in a counterclockwise direction viewed from the first coil layer 21*a* side of the magnetic permeability sensor 3*d*, and to be concentric with the detection coil 4. In other words, in the magnetic permeability sensor 3*d* according to the variation of the second embodiment, in the first coil layers 21*a* and 21*b*, the first wire 5*a* is a flat winding outside the detection coil 4 to be concentric with the detection coil 4.

In the second coil layer 23*a*, the fourth wire 6*a* constituting the reference coil 6 is patterned to start from the terminal 6*b* and to extend spirally to increase its radius in a clockwise direction viewed from the first coil layer 21*a* side of the magnetic permeability sensor 3*d*. The third wire 7*a* constituting the second drive coil 7 is patterned to start from the terminal 7*b* positioned outside the reference coil 6 and to extend spirally to increase its radius in a clockwise direction viewed from the first coil layer 21*a* side of the magnetic permeability sensor 3*d*, and to be concentric with the reference coil 6.

On the other hand, in the second coil layer 23*b*, the fourth wire 6*a* constituting the reference coil 6 is patterned to start from the terminal 6*b* and to extend spirally to increase its radius in a counterclockwise direction viewed from the first coil layer 21*a* side of the magnetic permeability sensor 3*d*. The third wire 7*a* constituting the second drive coil 7 is patterned to start from the terminal 7*b* positioned around the reference coil 6 and to extend spirally to increase its radius in a counterclockwise direction viewed from the first coil layer 21*a* side of the magnetic permeability sensor 3*d*. In other words, in the magnetic permeability sensor 3*d* according to the variation of the second embodiment, in the second coil layers 23*a* and 23*b*, the third wire 7*a* is a flat winding around the reference coil 6 to be concentric with the reference coil 6.

In the first coil layers 21*a* and 21*b*, the terminal 5*b* of the first drive coil 5 in the first coil layer 21*a* and the terminal 5*b* of the first drive coil 5 in the first coil layer 21*b* are electrically connected via the connection plug 27*g* formed to penetrate the upper insulating film 25*a*, so that drive current flowing in the first drive coils 5 have the same direction.

In addition, in the first coil layers 21*a* and 21*b*, the terminal 4*b* of the detection coil 4 in the first coil layer 21*a* and the terminal 4*b* of the detection coil 4 in the first coil layer 21*b* are electrically connected via the connection plug 27*h* formed to penetrate the upper insulating film 25*a*, so that induced current flowing in the detection coils 4 have the same direction.

In the second coil layers 23*a* and 23*b*, the terminal 7*b* of the second drive coil 7 in the second coil layer 23*a* and the terminal 7*b* of the second drive coil 7 in the second coil layer 23*b* are electrically connected via the connection plug 27*i* formed to penetrate the lower insulating film 25*c*, so that drive current flowing in the second drive coils 7 have the same direction.

In addition, in the second coil layers 23*a* and 23*b*, the terminal 6*b* of the reference coil 6 in the second coil layer 23*a* and the terminal 6*b* of the reference coil 6 in the second coil layer 23*b* are electrically connected via the connection plug 27*j* formed to penetrate the lower insulating film 25*c*, so that induced current flowing in the reference coils 6 have the same direction.

The terminal 4*c* of the detection coil 4 in the first coil layer 21*a* is positioned outside the detection coil 4. The terminal 6*c* of the reference coil 6 in the second coil layer 23*a* is positioned outside the reference coil 6. The terminal 4*c* and the terminal 6*c* are electrically connected via a connection plug 27*u* formed to penetrate in the insulating layer 25. In this way, induced current flowing in the detection coil 4 and induced current flowing in the reference coil 6 have opposite directions.

The terminal 5*c* of the first drive coil 5 in the first coil layer 21*b* is positioned outside the first drive coil 5. The terminal 7*c* of the second drive coil 7 in the second coil layer 23*a* is positioned outside the second drive coil 7. The terminal 5*c* and the terminal 7*c* are electrically connected via a connection plug 27*v* formed to penetrate the intermediate insulating film 25*b* and the lower insulating film 25*c*. In this way, drive current flowing in the first drive coil 5 and drive current flowing in the second drive coil 7 have the same direction.

In addition, in order to connect the amplifier circuit 12 (FIG. 3) to the detection coil 4 via the capacitor 14 (FIG. 3), a wiring 29*i* connected to the amplifier circuit 12 (FIG. 3) via the capacitor 14 (FIG. 3) and the terminal 4*c* outside the detection coil 4 of the first coil layer 21*b* are electrically connected via a connection plug 27*w* formed to penetrate the upper insulating film 25*a*.

In addition, in order to connect the amplifier circuit 12 (FIG. 3) to the reference coil 6 via the resistor 13 (FIG. 3), a wiring 29*j* connected to the amplifier circuit 12 (FIG. 3) via the resistor 13 (FIG. 3) and the terminal 6*c* of the reference coil 6 in the first coil layer 23*b* are electrically connected via a connection plug 27*x* formed to penetrate the lower insulating film 25*c*.

As described above, according to the present disclosure, the detection coil 4 and the first drive coil 5 are both formed in the first coil layer 21, and one of the coils is formed around the other coil to be concentric with the other coil. Accordingly, when the detection coil 4 and the first drive coil 5 are formed in the first coil layer 21, even if a position shift occurs in forming one of the coils, the same amount of position shift occurs in forming the other coil, and hence there is no change in the relative positional relationship between the detection coil 4 and the first drive coil 5. Accordingly, even if a position shift occurs in forming the detection coil 4 and the first drive coil 5, amount of magnetic flux passing through the detection coil 4 does not change in the state where there is no object to be detected.

In the same manner, the reference coil 6 and the second drive coil 7 are both formed in the second coil layer 23, and one of the coils is formed around the other coil to be concentric with the other coil. Accordingly, when the reference coil 6 and the second drive coil 7 are formed in the second coil layer 23, even if a position shift occurs in forming one of the coils, the same amount of position shift occurs in forming the other coil, and hence there is no change in the relative positional relationship between the reference coil 6 and the second drive coil 7. Accordingly, even if a position shift occurs in forming the reference coil 6 and the second drive coil 7, amount of magnetic flux passing through the reference coil 6 does not change in the state where there is no object to be detected.

In addition, a distance between the wire 4*a* forming the detection coil 4 and the wire 5*a* forming the first drive coil 5 arranged in parallel is shorter than in the case where the wire 4*a* forming the detection coil 4 and the wire 5*a* forming the first drive coil 5 are parallel flat windings. In other words, a capacitance between the detection coil 4 and the first drive coil 5 is smaller than in the case where the wire 4*a* forming the detection coil 4 and the wire 5*a* forming the first drive coil 5 are parallel flat windings. Accordingly, it is possible to reduce a possibility that a voltage variation of the first drive coil 5 causes a voltage variation of the detection coil 4 due to the capacitance between the first drive coil 5 and the detection coil 4.

In the same manner, a distance between the wire 6*a* forming the reference coil 6 and the wire 7*a* forming the second drive coil 7 arranged in parallel is shorter than in the case where the wire 6*a* forming the reference coil 6 and the wire 7*a* forming the second drive coil 7 are parallel flat windings. In other words, a capacitance between the reference coil 6 and the second drive coil 7 is smaller than in the case where the wire 6*a* forming the reference coil 6 and the wire 7*a* forming the second drive coil 7 are parallel flat windings. Accordingly, it is possible to reduce a possibility that a voltage variation of the second drive coil 7 causes a voltage variation of the reference coil 6 due to the capacitance between the second drive coil 7 and the reference coil 6.

Thus, according to the present disclosure, it is possible to provide the differential transformer magnetic permeability sensor that can suppress a variation of the output level of each sensor even if a position shift occurs in forming the detection coil, the reference coil, and the drive coil, as planar coils.

What is claimed is:

1. A differential transformer magnetic permeability sensor, comprising:

a plurality of first coil layers, each first coil layer including a first drive coil constituted of a first wire of a flat winding arranged on a plane and a detection coil constituted of a second wire of a flat winding arranged on the same plane as the first wire around the first drive coil to be concentric with the first drive coil;

a plurality of second coil layers, each second coil layer including a second drive coil constituted of a third wire of a flat winding arranged on a plane and a reference coil constituted of a fourth wire of a flat winding arranged on the same plane as the third wire around the second drive coil to be concentric with the second drive coil; and a first insulating layer disposed between the first coil layer and the second coil layer, wherein the first drive coil and the second drive coil are electrically connected to each other so that drive current flowing in the first drive coil and drive current flowing in the second drive coil have the same direction, the detection coil and the reference coil are electrically connected to each other so that induced current flowing in the detection coil and induced current flowing in the reference coil have opposite directions, the number of first coil layers and the number of second coil layers are the same, a second insulating layer sandwiched between two first coil layers among the plurality of first coil layers is disposed on one surface side of the first insulating layer, a third insulating layer sandwiched between two first coil layers among the plurality of second coil layers is disposed on the other surface side of the first insulating layer, first drive coils in the plurality of first coil layers are electrically connected so that drive current flowing in the first drive coils in the plurality of first coil layers have the same direction, second drive coils in the plurality of second coil layers are electrically connected so that drive current flowing in the second drive coils in the second coil layers have the same direction, detection coils in the plurality of first coil layers are electrically connected so that induced current flowing in the detection coils in the plurality of first coil layers have the same direction, and reference coils in the plurality of second coil layers are electrically connected so that induced current flowing in the reference coils in the plurality of second coil layers have the same direction.

2. A differential transformer magnetic permeability sensor, comprising:

a plurality of first coil layers, each including a detection coil constituted of a second wire of a flat winding arranged on a plane and a first drive coil constituted of a first wire of a flat winding arranged on the same plane as the second wire around the detection coil to be concentric with the detection coil;

a plurality of second coil layers, each including a reference coil constituted of a fourth wire of a flat winding arranged on a plane and a second drive coil constituted of a third wire of a flat winding arranged on the same plane as the fourth wire around the reference coil to be concentric with the reference coil; and a first insulating layer disposed between the first coil layer and the second coil layer, wherein the first drive coil and the second drive coil are electrically connected to each other so that drive current flowing in the first drive coil and drive current flowing in the second drive coil have the same direction, the detection coil and the reference coil are electrically connected to each other so that induced current flowing in the detection coil and induced current flowing in the reference coil have opposite directions, the number of first coil layers and the number of second coil layers are the same plural number, a second insulating layer sandwiched between two first coil layers among plurality of first coil layers is disposed on one surface side of the first insulating layer, a third insulating layer sandwiched between two first coil layers among the plurality of second coil layers is disposed on the other surface side of the first insulating layer, first drive coils in the plurality of first coil layers are electrically connected so that drive current flowing in the first drive coils in the plurality of first coil layers have the same direction, second drive coils in the plurality of second coil layers are electrically connected so that drive current flowing in the second drive coils in the second coil layers have the same direction, detection coils in the plurality of first coil layers are electrically connected so that induced current flowing in the detection coils in the plurality of first coil layers have the same direction, and reference coils in the plurality of second coil layers are electrically connected so that induced current flowing in the reference coils in the plurality of second coil layers have the same direction.

* * * * *